(12) United States Patent
Terashi et al.

(10) Patent No.: US 6,201,307 B1
(45) Date of Patent: Mar. 13, 2001

(54) CERAMICS FOR WIRING BOARDS AND METHOD OF PRODUCING THE SAME

(75) Inventors: Yoshitake Terashi; Shinya Kawai, both of Kagoshima (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 09/338,023

(22) Filed: Jun. 22, 1999

(30) Foreign Application Priority Data

Jun. 23, 1998 (JP) .................................................. 10-175915
Jul. 9, 1998 (JP) .................................................. 10-194653

(51) Int. Cl.[7] .................................................. H01L 21/44
(52) U.S. Cl. ........................... 257/784; 257/734; 257/746
(58) Field of Search ............................. 438/106; 257/784, 257/734, 746

(56) References Cited

U.S. PATENT DOCUMENTS 5,378,662 * 1/1995 Tsuyuki .
5,763,059 * 6/1998 Yamaguchi et al. .
5,916,834 * 6/1999 Terashi et al. .

* cited by examiner

Primary Examiner—Kevin M. Picardat
Assistant Examiner—D. M. Collins
(74) Attorney, Agent, or Firm—Hogan & Hartson, LLP.

(57) ABSTRACT

Ceramics for wiring boards having an $SiO_2$ crystal phase, a spinel type oxide crystal phase containing Mg or Zn and Al and a composite oxide type crystal phase containing at least Sr, Al and Si, and having a coefficient of thermal expansion of not smaller than 5.5 ppm/° C. at room temperature through up to 400° C., a dielectric constant of not larger than 7, and a dielectric loss of not larger than $50 \times 10^{-4}$ at 20 to 30 GHz. The ceramics can be obtained by the co-firing with a low-resistance metal such as copper or silver, and can be advantageously applied for the production of a wiring board for treating, particularly, signals of high frequencies. Furthermore, the ceramics has a coefficient of thermal expansion which is so large as can be brought close to the coefficient of thermal expansion of the semiconductor element such as GaAs or of the printed board. Therefore, the wiring board produced by using the ceramics makes it possible to effectively prevent the mounting portions from being damaged by the difference in the thermal expansion.

8 Claims, 2 Drawing Sheets

CERAMICS FOR WIRING BOARDS AND METHOD OF PRODUCING THE SAME

BACKGROUND OF THE INVENTION

1. Field of the Invention

The present invention relates to ceramics for forming a variety kinds of wiring boards such as packages for accommodating semiconductor device and multi-layer wiring boards. Particularly, the invention relates to ceramics for wiring boards produced by the co-firing with a low-resistance conductor such as copper, gold, silver or the like metal and to a method of producing the same.

2. Description of the Prior Art

The most widely used ceramic wiring board can be represented by the one having a wiring layer of a high-melting metal such as tungsten (W) or molybdenum (Mo) formed on the surface or in the inside of an insulating substrate of an aluminous sintered product.

In recent years, however, the frequency band of signals in which the wiring boards are used is shifting toward the ever high frequency region accompanying the a trend toward the highly sophisticated information technology. In the wiring boards which must transmit signals of such high frequencies, it is required to decrease the resistance of the conductor forming the wiring layer and to decrease the dielectric loss of the insulating substrate in a high-frequency region, in order to transmit high-frequency signals without loss.

However, the wiring layer formed on the above-mentioned conventional ceramic wiring board, i.e., the wiring layer formed of a high-melting metal such as W or Mo, has a large electric resistance and permits signals to propagate at a low speed. With such a wiring layer, furthermore, it is difficult to transmit high-frequency signals of not lower than 1 GHz. Therefore, it becomes necessary to form a wiring layer using a low-resistance metal such as copper, silver or gold instead of using W or Mo. However, these low-resistance metals have such low melting points that the wiring layer is not formed by the co-firing with alumina.

Recently, therefore, there has been developed a wiring board using an insulating substrate made of so-called glass ceramics comprising a composite material of a glass and ceramics. The glass ceramics has a dielectric constant of as low as about 3 to 7, and is not only suited for transmitting high-frequency signals compared to alumina ceramics but is also obtained by the firing at a temperature as low as from 800 to 1000° C., lending itself well for being co-fired with a low-resistance metal such as copper, gold, silver or the like metal.

For example, Japanese Examined Patent Publication (Kokoku) No. 12639/1992 proposes a wiring substrate obtained by forming a wiring pattern of a low-resistance metal such as copper, silver or gold on a green sheet formed of a glass and an $SiO_2$ filler, and co-firing the green sheet and the wiring pattern at 900 to 1000° C.

Furthermore, Japanese Unexamined Patent Publication (Kokai) No. 240135/1985 proposes a wiring board obtained by co-firing a green sheet comprising a filler such as $Al_2O_3$, zirconia or mullite and a zinc borosilicate glass together with a wiring pattern of a low-resistance metal.

Japanese Unexamined Patent Publication (Kokai) No. 298919/1993 discloses glass ceramics in which mullite or cordierite is precipitated as a crystal phase.

The above-mentioned conventional glass ceramics can be formed by the co-firing with a low-resistance metal, but have a defect in that they have small coefficients of thermal expansion (about 3 to 5 ppm/° C.).

That is, the wiring board is used mounting a variety of electronic parts (e.g., a chip of GaAs, etc.) thereon or being mounted on a printed board such as a mother board formed of an organic resin. The mounting is executed by the so-called brazing which produces a thermal stress between the wiring board and the printed board. The thermal stress is also generated between the wiring board and the printed board by the thermal hysteresis of when the semiconductor device or the like is operated and stopped repetitively. Here, the chip such as of GaAs has a coefficient of thermal expansion of from 6 to 7.5 ppm/° C. and the printed board has a coefficient of thermal expansion of from 12 to 15 ppm/° C., which are greatly different from the coefficient of thermal expansion of the above-mentioned glass ceramics. In the wiring board equipped with an insulating substrate formed of the known glass ceramics, therefore, the mounting portion is peeled off or is cracked due to the thermal stress at the time of mounting or due to the thermal stress of when the semiconductor device is operated and stopped repetitively, that stems from a large difference in the coefficient of thermal expansion. Therefore, such a wiring board has a very low reliability for mounting and is not satisfactory from a practical point of view.

Furthermore, the conventional glass ceramics has a large dielectric loss in the high-frequency region. Therefore, the wiring board equipped with an insulating substrate of such glass ceramics exhibits poor high-frequency characteristics and cannot be used for high-frequency applications where high-frequency signals are handled such as microwaves and millimeter waves.

SUMMARY OF THE INVENTION

The object of the present invention, therefore, is to provide ceramics for wiring boards, which can be formed by the co-firing with a low-resistance metal such as gold, silver or copper, has a coefficient of thermal expansion close to that of a chip of GaAs or close to that of a printed board, and has a small dielectric loss in a high-frequency region, and a method of producing the same.

According to the present invention, there is provided ceramics for wiring boards having an $SiO_2$ crystal phase, a spinel type oxide crystal phase containing Mg or Zn and Al and a composite oxide type crystal phase containing at least Sr, Al and Si, and having a coefficient of thermal expansion of not smaller than 5.5 ppm/° C. at 25° C. through up to 400° C., a dielectric constant of not larger than 7, and a dielectric loss of not larger than $50 \times 10^{-4}$ at 20 to 30 GHz.

According to the present invention, furthermore, there is provided a method of producing ceramics for wiring boards by molding, into a predetermined shape, a mixture powder containing from 50 to 95% by weight of a glass powder containing $SiO_2$, $Al_2O_3$, MgO, ZnO and $B_2O_3$ and capable of precipitating a spinel type oxide crystal phase, and from 0.1 to 50% by weight of a composite oxide of SrO and $SiO_2$, followed by firing at a temperature of from 800 to 1000° C.

In this specification, the coefficient of thermal expansion is the one over a temperature range of from room temperature (25° C.) through up to 400° C. unless stated otherwise.

DETAILED DESCRIPTION OF THE INVENTION

Production of Ceramics for Wiring Boards

Figure 1:
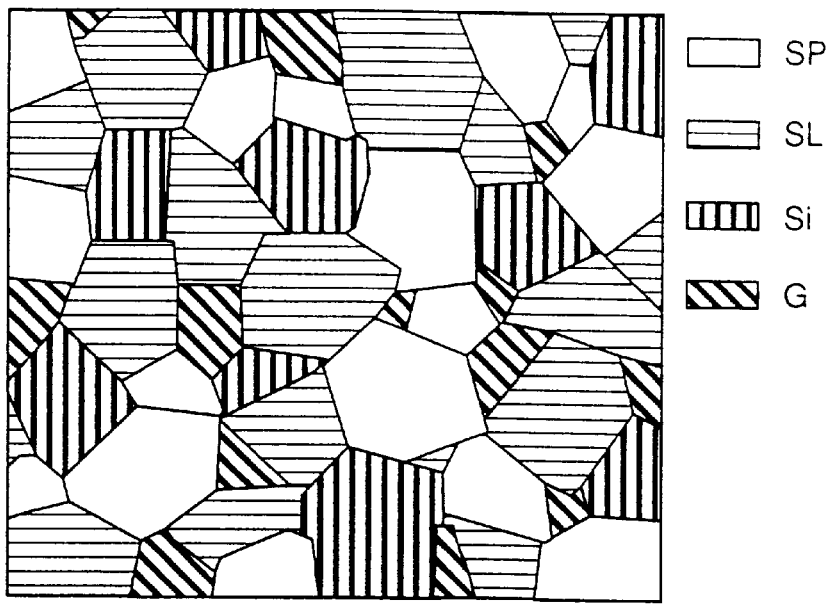
FIGS. 1 and 2 are diagrams illustrating the texture of ceramics for wiring boards of the present invention.

The ceramics for wiring boards of the present invention is prepared by using, as a starting material, a mixture powder of a glass powder and a composite oxide of SrO and $SiO_2$.

Starting Materials:

As a glass powder, there can be used the one capable of precipitating a spinel type oxide crystal phase, and containing at least $SiO_2$, $Al_2O_3$, MgO, ZnO and $B_2O_3$. That is, upon the firing, the glass powder precipitates the spinel type oxide crystal phase containing Mg or Zn and Al, such as a spinel crystal phase represented by $MgAl_2O_4$, a gahnite crystal phase represented by $ZnAl_2O_4$, or a mixture phase of a solid solution of the two and represented by $(Zn, Mg)Al_2O_4$. Such a spinel type oxide crystal phase and, particularly, a gahnite crystal phase has a high thermal expansion property (7 to 8 ppm/° C.) and works to increase the coefficient of thermal expansion of the obtained ceramics.

Though there is no particular limitation so far as the above-mentioned spinel type oxide crystal phase is precipitated, it is desired that the contents of the oxide components in the glass powder are 40 to 52% by weight of $SiO_2$, 14 to 32% by weight of $Al_2O_3$, 5 to 24% by weight of MgO, 1 to 16% by weight of ZnO, and 5 to 15% by weight of $B_2O_3$, from the standpoint of decreasing the dielectric constant of the obtained ceramics, increasing the thermal expansion thereof and increasing the strength thereof. In order to maximize the effect stemming from the precipitation of the spinel type oxide crystal phase, furthermore, it is desired that the total amount of ZnO and MgO is over a range of from 6 to 30% by weight. It is further desired that the glass powder has a softening point of from 500 to 800° C.

The mixture powder which is the starting material should contain the glass powder in an amount over a range of from 50 to 95% by weight. When the content of the glass powder is smaller than 50% by weight, it becomes difficult to conduct the firing at a temperature not higher than 1000° C. When the content of the glass powder exceeds 95% by weight, on the other hand, the glass melts at a firing temperature making it difficult to produce a sintered product.

The composite oxide of SrO and $SiO_2$ (hereinafter often called Sr—Si composite oxide) to be mixed into the above-mentioned glass powder is a filler component, and is used, most desirably, in the form of $SrSiO_3$. Use of such a composite oxide makes it possible to greatly enhance the sintering property, enabling the sintering to be conducted at a temperature of not higher than 1000° C. and, besides, making it possible to decrease voids in the sintered product.

The SrO component in the Sr—Si composite oxide reacts with the $Al_2O_3$ component or the $SiO_2$ component in the glass powder to precipitate a composite oxide type crystal phase containing Sr, Al and Si, such as slawsonite crystal phase represented by $SrAl_2Si_2O_8$, so that the obtained ceramics exhibits an increased coefficient of thermal expansion. That is, though the glass phase containing $Al_2O_3$ or $SiO_2$ exhibits a coefficient of thermal expansion of as low as from 4 to 5 ppm/° C., the slawsonite crystal phase exhibits a coefficient of thermal expansion of from 5 to 8 ppm/° C., which is larger than that of the glass phase. Upon precipitating the slawsonite crystal phase as described above, therefore, it is allowed to increase the coefficient of thermal expansion of the ceramics by about 0.5 to 2 ppm/° C. compared with that of when the slawsonite crystal phase is not precipitated.

Furthermore, the $SiO_2$ component in the Sr—Si composite oxide is precipitated as the $SiO_2$ crystal phase (e.g., quartz). The $SiO_2$ crystal phase such as quartz has a very high coefficient of thermal expansion (13 to 20 ppm/° C.). Upon precipitating the $SiO_2$ crystal phase, therefore, the obtained ceramics exhibits a very large coefficient of thermal expansion.

The mixture powder which is the starting material should contain the Sr—Si composite oxide in an amount of from 0.1 to 50% by weight and, particularly, from 5 to 25% by weight in terms of $SrSiO_3$. When the amount of the Sr—Si composite oxide is not larger than 0.1% by weight, the sintering property is improved little and the voids decreases little. Besides, the composite oxide type crystal phase such as of slawsonite is not formed, and it becomes difficult to obtain the ceramics having a large coefficient of thermal expansion. When the amount of the Sr—Si composite oxide is larger than 50% by weight, on the other hand, the sintering property is impaired.

In the present invention, the $SiO_2$ powder can be used as a filler in addition to the glass powder and the composite oxide. Use of the $SiO_2$ powder makes it possible to precipitate the $SiO_2$ crystal phase having a large coefficient of thermal expansion, such as quartz, cristobalite or tridymite, to further increase the coefficient of thermal expansion of the obtained ceramics.

The mixture powder which is the starting material should contain the $SiO_2$ powder in an amount of not larger than 40% by weight. When the amount of the $SiO_2$ powder exceeds 40% by weight, it becomes difficult to sinter the mixture powder. That is, it becomes difficult to obtain dense ceramics upon the firing at a temperature of not higher than 1000° C.

In the present invention, furthermore, it is allowable to use a composite oxide of CaO and $ZrO_2$ (hereinafter often called Ca—Zr composite oxide), such as $CaZrO_3$ in addition to the above-mentioned Sr—Si composite oxide. Use of this composite oxide enables fine $ZrO_2$ particles to be uniformly precipitated and dispersed in the obtained ceramics, making it possible to greatly increase the strength of the ceramics and, hence, to obtain highly strong ceramics having a flexural strength of not smaller than 200 MPa. The CaO component in the composite oxide reacts with the $Al_2O_3$ component and $SiO_2$ component in the glass powder together with the SrO component in the Sr—Si composite oxide, and are incorporated in the composite oxide type crystal phase that contains Sr, Al and Si. When the Ca—Zr composite oxide is used, therefore, the precipitated crystal phase is represented by $Sr_{1-x}Ca_xAl_2Si_2O_8$ (wherein x is a number of 0<x<1). The slawsonite crystal phase incorporating Ca has a coefficient of thermal expansion of as relatively large as 5 to 8 ppm/° C., and works to increase the coefficient of thermal expansion of the ceramics.

In the present invention, the Ca—Zr composite oxide is used in an amount of not larger than 15% by weight, preferably, from 0.1 to 15% by weight and, most preferably, from 5 to 10% by weight in terms of $CaZrO_3$ per the total amount of the mixture powder which is the starting material. When this amount exceeds 15% by weight, the obtained ceramics exhibits a dielectric constant of not smaller than 7. When the amount is not larger than 0.1% by weight, on the other hand, improvement in the strength relying on the $ZrO_2$ particles is not expected.

Molding and Firing:

The above-mentioned mixture powder which is the starting material is dispersed in a known suitable organic solvent to prepare a slurry which is then molded into a sheet-like article (green sheet) by a known means, such as doctor blade method, calender roll method, rolling method or press-molding method. The green sheet is fired in an oxidizing or non-oxidizing atmosphere at a temperature of from 800 to 1000° C. to obtain dense ceramics for wiring boards having a relative density of, for example, not smaller than 97%.

That is, the ceramics for the wiring boards of the present invention is obtained through the firing at a temperature of from 800 to 1000° C. In the step of production, therefore, the green sheet can be co-fired together with a low-resistance metal such as copper, gold or silver, and is very useful for the production of a wiring board having a low-resistance metal as a wiring layer.

Ceramics for Wiring Boards

Figure 2:
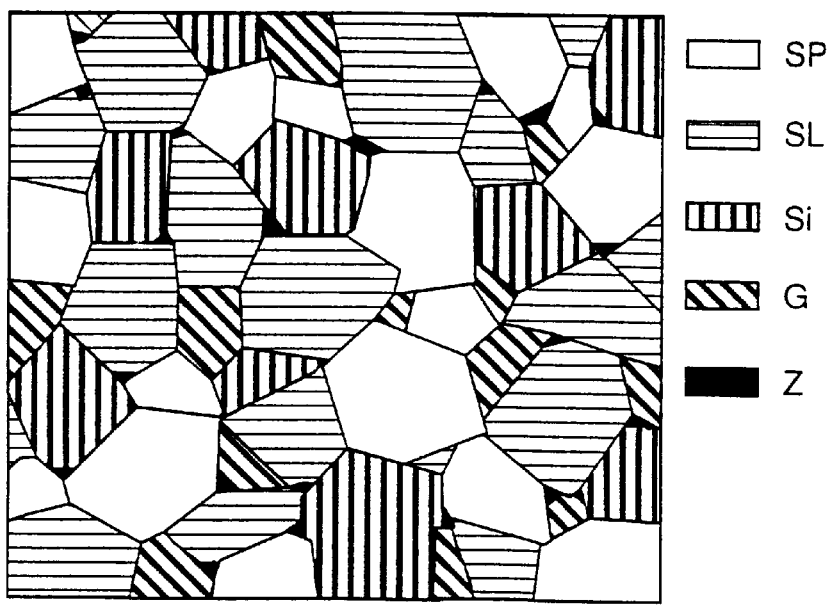

The thus obtained ceramics for wiring boards of the present invention contains effectively suppressed amounts of voids, has a relative density of not smaller than 97%, and has a texture as shown in FIG. 1 or 2. FIG. 1 shows the texture of the ceramics obtained by using the Sr—Si composite oxide only as a composite oxide used in combination of glass powder and $SiO_2$ filler, and FIG. 2 shows the texture of the ceramics obtained by using the Sr—Si composite oxide and the Ca—Zr composite oxide.

In the ceramics for wiring boards of the present invention as will be clear from FIGS. 1 and 2, the spinel type oxide crystal phase (SP), $SiO_2$ crystal phase (Si) and composite oxide crystal phase (SL) containing Sr, Al and Si are precipitated as crystal phases. An amorphous glass phase (G) usually exists on the grain boundaries of these crystal phases.

Preferred contents of metal elements in the ceramics for wiring boards, on the basis of oxides, are as follows:

| | |
|---|---|
| $SiO_2$: | 30 to 60% by weight |
| $Al_2O_3$: | 19 to 28% by weight |
| MgO: | 5 to 13% by weight |
| ZnO: | 5 to 35% by weight |
| $B_2O_3$: | 5 to 12% by weight |
| SrO: | 1 to 3% by weight |

It is further desired that $ZrO_2$ is contained in an amount of from 2.5 to 6% by weight in the ceramics that has an increased strength as a result of using the Ca—Zr composite oxide.

The spinel type oxide crystal phase (SP), which has a spinel structure, precipitates due to the reaction of $Al_2O_3$, MgO and ZnO in the glass, and contains Mg or Zn and Al as metal components. As the spinel type oxide crystal phase (SP), there can be exemplified a spinel crystal phase represented by $MgAl_2O_4$, a gahnite crystal phase represented by $ZnAl_2O_4$ or a mixed phase of the solid solution of the two represented by $(Zn, Mg)Al_2O_4$. In the present invention, the gahnite crystal phase is preferred since it has a large coefficient of thermal expansion (7 to 8 ppm/° C.).

The $SiO_2$ crystal phase (Si) is precipitated from the $SiO_2$ component in the Sr—Si composite oxide or from the $SiO_2$ powder used, as required, as a filler, and its examples are quartz, cristobalite and tridymite as described above already. The $SiO_2$ crystal phase (Si) has a particularly large coefficient of thermal expansion (13 to 20 ppm/° C.). In the present invention, however, quartz is preferred. The cristobalite and tridymite have an inflection point in the coefficient of thermal expansion near 200° C., and the coefficient of thermal expansion sharply changes near 200° C. during the use. Therefore, the connection terminals between the wiring board that will be described later and the external circuit board are worn out and are often broken due to the repetitive thermal hysteresis.

The composite oxide type crystal phase (SL) containing Sr, Al and Si is precipitated as the SrO component in the Sr—Si composite oxide reacts with the $Al_2O_3$ component and the $SiO_2$ component in the glass powder, and its example is the slawsonite crystal phase represented by $SrAl_2Si_2O_8$. This crystal phase (SL), too, has a relatively large coefficient of thermal expansion (5 to 8 ppm/° C.). When the Ca—Zr composite oxide is used as the composite oxide, the CaO component is incorporated in the crystal phase (SL) as described earlier, and the slawsonite crystal phase represented by $Sr_{1-x}Ca_xAl_2Si_2O_8$ (0<x<1) precipitates. The Ca-containing slawsonite crystal phase, too, has a coefficient of thermal expansion of 5 to 8 ppm/° C.

When the Ca—Zr composite oxide is used as shown in FIG. 2, the fine $ZrO_2$ particles having an average particle diameter of not larger than 1 μm and, preferably, not larger than 0.5 μm have been uniformly precipitated on the grain boundaries of the crystals, contributing to markedly increasing the strength of the ceramics.

In the present invention, it is desired that the amorphous glass phase (G) is consituted by $Al_2O_3$, MgO, ZnO, $SiO_2$, $B_2O_3$, etc., and a part of the SrO component and the CaO component in the composite oxide is further existing in the glass phase (G) from the standpoint of suppressing the leakage of helium from the ceramics.

Furthermore, the above-mentioned various crystal phases may be those in which there exist other metal components that unavoidably stem from impurities in the form of a solid solution, unless their crystal structures are not changed.

As described above, the ceramics for wiring boards of the present invention suppresses the formation of the glass phase (G) and permits various crystal phases having high thermal expansion to be precipitated and, hence, has a coefficient of thermal expansion of not smaller than 5.5 ppm/° C. at room temperature (25° C.) through up to 400° C., which is larger than that of the conventional glass ceramics. The coefficient of thermal expansion of the ceramics can be easily adjusted by adjusting various crystal phases and, particularly, by adjusting the precipitating amount of the $SiO_2$ crystal phase such as quartz or the like. That is, the $SiO_2$ crystal phase has a very large coefficient of thermal expansion. Therefore, the coefficient of thermal expansion can be greatly increased by using the $SiO_2$ powder as a filler in an amount as much as possible.

In the ceramics for wiring boards of the present invention, therefore, the amount of the $SiO_2$ powder is controlled to adjust the difference in the coefficient of thermal expansion from the chip such as of GaAs or from the printed board to be within 2 ppm/° C. Thus, there is obtained a wiring board featuring an improved reliability in the structure for mounting the chip or the printed board.

In the present invention, furthermore, Al, Mg and Zn in the glass phase (G) are migrating into the crystal phase. Therefore, the ceramics has a dielectric constant of not larger than 7 and, particularly, not larger than 5, and a dielectric loss of not larger than 50×104 and, particularly, not larger than 30×10$^{-4}$ at 20 to 30 GHz.

The wiring board obtained from such ceramics is suited for dealing with signals of high frequencies.

Owing to the use of the Ca—Zr composite oxide, furthermore, the ceramics in which the fine $ZrO_2$ particles are precipitating exhibits a flexural strength of not smaller than 200 MPa and, particularly, not smaller than 220 MPa and, more particularly, not smaller than 230 MPa. The wiring board obtained from such ceramics is very excellent from the standpoint of mechanical properties, too.

Wiring Board

By using the ceramics of the present invention, the wiring board is produced in a manner as described below.

That is, a green sheet having a composition corresponding to the ceramics of the present invention is prepared according to the method described above. Then, as required, a through hole is formed in the green sheet and is filled with a metal paste containing a low-resistance metal such as copper, gold or silver. Then, the wiring pattern is printed by the screen printing method, gravure printing method or the like method. The metal paste is then applied onto the green sheet in the shape of a pattern of the wiring layer (about 5 to 30 μm thick). A plurality of green sheets having a wiring layer pattern formed thereon are overlapped one upon the other so that the through holes acquire a predetermined position and are press-adhered, followed by the co-firing at 800 to 1000° C. and, particularly, at 830 to 1000° C. in an oxidizing atmosphere or in a non-oxidizing atmosphere ($N_2$ or $N_2+H_2$) to obtain a wiring board of a structure in which an insulating substrate is formed of the ceramics of the present invention and a wiring layer is formed inside or on the surface of the insulating substrate.

A chip is suitably mounted on the wiring board and is connected to the wiring layer on the wiring board in a manner that the signals can be transmitted. The connection is accomplished by, for example, mounting the chip directly on the wiring layer using solder balls or the like, or securing the chip onto the insulating substrate using a suitable adhesive, and connecting the chip to the wiring layer by wire-bonding or a TAB tape. A semiconductor device of the Si type or the GaAs type can be used as the chip. According to the present invention, the coefficient of thermal expansion of the insulating substrate is brought close to that of the chip to improve the reliability of mounting. Therefore, a semiconductor device of the GaAs type having a particularly large coefficient of thermal expansion (6 to 7.5 ppm/° C.) can be advantageously used.

A cap made of the same material as the insulating substrate or any other insulating material or a metal having good heat-radiating property, is joined to the surface of the wiring board on which the chip such as the semiconductor device or the like is mounted by using an adhesive such as a glass, a resin or a brazing material, thereby to hermetically seal the chip. The air-tight sealing is usually inspected by using an He gas. The insulating substrate in the wiring board has been formed of the ceramics of the present invention and in which voids are formed in very suppressed amounts and the He gas is not almost adsorbed. This offers an advantage in that the air-tightness is inspected highly precisely and reliably.

Figure 3:
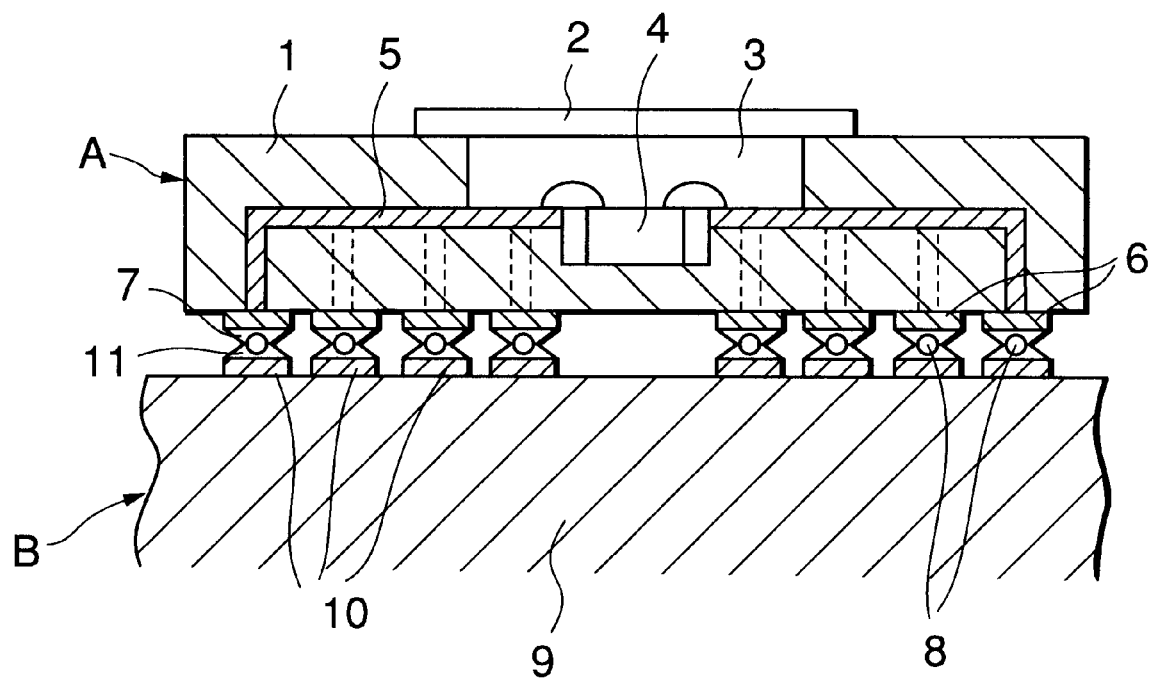
FIG. 3 is a sectional view schematically illustrating the mounting structure of a semiconductor package (package mounting a semiconductor device) formed by using the ceramics for wiring boards of the present invention.

FIG. 3 illustrates an example in which the wiring board formed of the ceramics of the present invention is used as a package for mounting the semiconductor device. In FIG. 3, the package A is of the ball grid array (BGA) type in which the connection terminals are ball terminals. The package A includes an insulating substrate 1 and a closure member 2. A cavity 3 is formed by the insulating substrate 1 and the closure member 2, and a chip 4 such as of GaAs is mounted in the cavity 3. The insulating substrate 1 is constituted by the above-mentioned ceramics of the present invention.

A wiring layer 5 is formed on the surface of the insulating substrate 1, and the semiconductor device 4 in the cavity 3 is electrically connected to the wiring layer so that signals of high frequencies can be transmitted to, and from, the wiring layer 5. The connection is accomplished by mounting the semiconductor device 4 directly on the wiring layer 5, or by wire-bonding or a TAB tape.

It is desired that the wiring layer 5 is formed of a low-resistance metal such as copper, silver or gold in order to decrease the conductor loss as much as possible during the transmission of signals of high frequencies. When the signals of high frequencies of not lower than 1 GHz are to be transmitted through the wiring layer 5, furthermore, it is desired that the wiring layer 5 is constituted by any one of a strip line, a microstrip line, a coplanar line or a dielectric waveguide in order to transmit the signals of high frequencies with little loss. When the wiring layer 5 constitutes the above-mentioned line, therefore, a conductor layer such as ground layer is formed in the insulating substrate 1.

On the bottom surface of the insulating substrate 1, furthermore, there are formed electrode layers 6 for connection to an external circuit board B. The electrode layers 6 for connection are connected to the wiring layer in the package A, and to which are further secured ball-like terminals 8 by a brazing material 7 such as solder. The external circuit board B has an insulating substrate 9 formed of an insulating material (having a coefficient of thermal expansion of from 12 to 15 ppm/° C.) containing organic resins such as polyimide resin, epoxy resin and phenolic resin, and wiring layers 10 are formed on the insulating substrate 9. That is, the ball-like terminals 8 provided on the electrode layers 6 on the insulating substrate 1 of the package A are connected to the wiring layers 10 formed on the external circuit board B by using a brazing material 11 such as Pb—Sn, so that the wiring layer 5 in the package A is electrically connected to the wiring layers 10 on the external circuit board B. It is further allowable to melt the ball-like terminals 8 to connect the electrode layers 6 to the wiring layer 10.

As described earlier, the ceramics of the present invention constituting the insulating substrate 1 has a dielectric loss of not larger than 50×10$^{-4}$ at 20 to 30 GHz, and a dielectric constant of not larger than 7. Therefore, the above-mentioned package A makes it possible to efficiently transmit the signals of high frequencies with a small loss.

The ceramics constituting the insulating substrate 1 has a coefficient of thermal expansion of not smaller than 5.5 ppm/° C. Upon adjusting the precipitated crystal phase and, particularly, the $SiO_2$ phase such as quartz, furthermore, the coefficient of thermal expansion can be brought close to that of the chip 4 such as of GaAs and can be further brought close to the coefficient of thermal expansion of the insulating substrate 9 of the external circuit board B, to effectively decrease the stress caused by a difference in the thermal expansion. By forming the wiring board using the ceramics of the present invention, therefore, the mounting portion is effectively prevented from being damaged or the wiring layer is effectively prevented from being peeled off or from being broken, that stems from the thermal stress at the time when the chip is mounted on the wiring board, when the wiring board is mounted on the external circuit board B, or when the semiconductor device is operated and stopped repetitively. Therefore, the mounting structure maintains reliability for extended periods of time.

EXAMPLE 1

The two kinds of crystallized glasses were prepared having compositions described below and being capable of precipitating spinel type oxide crystal phase.

Glass A: 44% by weight of $SiO_2$-29% by weight of $Al_2O_3$-11% by weight of MgO-7% by weight of ZnO-9% by weight of $B_2O_3$ Glass B: 44% by weight of $SiO_2$-26% by weight of $Al_2O_3$-19% by weight of MgO-1% by weight of ZnO-10% by weight of $B_2O_3$ To the crystallized glass powders were mixed an $SiO_2$ (quartz) powder and an $SrSiO_3$ powder having average particle diameters of not larger than 182 m to comply with the compositions shown in Tables 1 and 2.

To the mixtures were added an organic binder, a plasticizer and toluene to prepare slurries which were then molded into green sheets having a thickness of 300 μm by the doctor blade method. Five pieces of the green sheets were laminated one upon the other and were adhered at a temperature of 50° C. under a pressure of 100 kg/cm$^2$. After the binder was removed in a water vapor-containing nitrogen atmosphere at 700° C., the laminated sheets were fired in dry nitrogen under the conditions shown in Tables 1 and 2 to obtain ceramics for insulating substrates.

The obtained ceramics were evaluated for their dielectric constants and dielectric losses according to the methods described below.

The samples were cut into disks of a diameter of 10 mm and a thickness of 5 mm and were measured for their dielectric constants and dielectric losses relying on the dielectric cylinder resonator method at 20 to 30 GHz by using a network analyzer and a synthesized sweeper. The measurement was taken by sandwiching a sample dielectric substrate between the copper plate jigs of a diameter of 50 mm. The dielectric constant and the dielectric loss were calculated from the resonance characteristics of the resonator in the TE011 mode. Furthermore a curve of thermal expansion was drawn at room temperature through up to 400° C., and the average of the coefficient of thermal expansion was calculated therefrom. The crystal phase in the sintered product was identified from the X-ray diffraction measurement.

For some samples, an $Al_2O_3$ powder and a cordierite powder were used as filler components instead of $SrSiO_3$ and $SiO_2$, and the ceramics were prepared in the same manner and were evaluated (samples Nos. 9, 10, 22, 23). Instead of the above-mentioned crystallized glasses A and B, furthermore, the glasses C, D and E of the following compositions were used to evaluate the ceramics in the same manner as described above (samples Nos. 24 to 28).

Glass C: 10.4% by weight of $SiO_2$-2.5% by weight of $Al_2O_3$-45.3% by weight of $B_2O_3$-35.2% by weight of CaO-6.6% by weight of $Na_2O$ Glass D: 14% by weight of $SiO_2$-24.7% by weight of $Al_2O_3$-22.6% by weight of $B_2O_3$-14.2% by weight of BaO-12.8% by weight of $Li_2O$-11.7% by weight of $Na_2O$ Glass E: 31% by weight of $SiO_2$-5% by weight $Al_2O_3$-35% by weight of $B_2O_3$-25% by weight of BaO-4% by weight of MgO

TABLE 1

| Sample No. | Composition (% by weight) | | | | | Firing condition | | Dielectric const. | Dielectric loss ×10$^{-4}$ | Coefficient of thermal expansion (ppm/° C.) | Detected crystal phase Note 1) |
|---|---|---|---|---|---|---|---|---|---|---|---|
| | Glass kinds | Glass amount | SiO$_2$ | SrSiO$_3$ | others | temp. (° C.) | time (hr) | | | | |
| *1 | A | 97 | 1 | 2 | — | 850 | 1 | — | — | — | melted |
| *2 | A | 96 | 4 | — | — | 900 | 1 | 4.9 | 55 | 10.0 | Si > SP > Co |
| 3 | A | 95 | 4.9 | 0.1 | — | 850 | 1 | 5.5 | 45 | 10.0 | Si > SP > SL |
| 4 | A | 80 | 5 | 15 | — | 875 | 1 | 5.5 | 30 | 8.8 | Si > SP > SL |
| 5 | A | 70 | 10 | 20 | — | 900 | 1 | 5.6 | 19 | 8.0 | Si > SL > SP |
| 6 | A | 65 | 10 | 25 | — | 925 | 1 | 5.7 | 20 | 7.5 | SL > Si > SP |
| 7 | A | 70 | — | 30 | — | 850 | 1 | 5.3 | 25 | 5.6 | SL > Si > SP |
| *8 | A | 95 | 4.95 | 0.05 | — | 825 | 1 | 5.2 | 30 | 5.1 | SP > Si > Co |
| *9 | A | 75 | — | — | Al$_2$O$_3$ 25 | 975 | 1 | 5.8 | 46 | 5.3 | SP > Al > Co |
| *10 | A | 75 | — | — | cordierite 25 | 1000 | 1 | 5.3 | 100 | 5.0 | Co > SP |
| 11 | A | 50 | 5 | 45 | — | 950 | 1 | 6.5 | 23 | 5.6 | SL > Si > SP |
| 12 | A | 50 | — | 50 | — | 975 | 1 | 6.9 | 24 | 5.5 | SL > Si > SP |
| *13 | A | 50 | 45 | 5 | — | 1000 | 2 | not dense | | | — |
| *14 | A | 30 | 20 | 50 | — | 1000 | 3 | not dense | | | — |
| *15 | A | 45 | — | 55 | — | 1000 | 1 | not dense | | | — |
| 16 | A | 65 | 20 | 15 | — | 850 | 1 | 5.3 | 49 | 10.2 | SP > SL, Si |
| 17 | A | 75 | 24.9 | 0.1 | — | 950 | 1 | 5.2 | 22 | 11.5 | Si > SP > SL |

Samples marked with * lie outside the scope of the invention.
Note 1) SP: spinel, SL: slawsonite, Co: cordierite, Si: quarts, Al: Al$_2$O$_3$

TABLE 2

| Sample No. | Glass kinds | Glass amount | SiO$_2$ | SrSiO$_3$ | others | Firing condition temp. (°C.) | Firing condition time (hr) | Dielectric const. | Dielectric loss ×10$^{-4}$ | Coefficient of thermal expansion (ppm/°C.) | Detected crystal phase Note 1) |
|---|---|---|---|---|---|---|---|---|---|---|---|
| 18 | B | 50 | 1 | 49 | — | 950 | 1 | 6.8 | 26 | 5.5 | SL > Si > SP |
| 19 | B | 60 | 10 | 30 | — | 950 | 1 | 6.0 | 25 | 5.6 | SL > Si > SP |
| 20 | B | 70 | 5 | 25 | — | 925 | 1 | 5.9 | 24 | 5.9 | SL > Si > SP |
| 21 | B | 80 | — | 20 | — | 875 | 1 | 6.1 | 22 | 6.7 | Si > SL > SP |
| *22 | B | 85 | — | — | Al$_2$O$_3$ 15 | 1000 | 1 | 6.0 | 60 | 5.1 | SP > Co > Al |
| *23 | B | 80 | — | — | cordierite 20 | 850 | 0.5 | 5.4 | 110 | 4.9 | SP > Co |
| *24 | C | 75 | 10 | 15 | — | 800 | 1 | not measurable | — | W > SS, CS > Si |
| *25 | C | 50 | 15 | 35 | — | 850 | 1 | 5.5 | 100 | 15.2 | Si> W > SS, CS |
| *26 | D | 75 | 10 | 15 | — | 800 | 1 | not measurable | 20.3 | S>SL |
| *27 | D | 60 | 25 | 15 | — | 850 | 1 | 6.0 | 150 | 17.1 | S, SL |
| *28 | E | 50 | — | CaSiO$_3$ 30 | Al$_2$O$_3$ 20 | 900 | 1 | 6.7 | 130 | 5.5 | An, S |

Samples marked with * lie outside the scope of the invention.
Note 1) SP: spinel, SL: slawsonite, Co: cordierite, W: willemite, Si: quarts, Al: Al$_2$O$_3$, S: celsian, SS: SrSiO$_3$, CS: CaSiO$_3$, An: anorthite As will be clear from the results of Table 1, the ceramics of the present invention all exhibited coefficients of thermal expansion of not smaller than 5.5 ppm/° C., and excellent dielectric properties such as dielectric constants of not larger than 7, and dielectric losses of not larger than 50×10$^{-4}$ as measured at frequencies of from 20 to 30 GHz. Furthermore, in a sealing test using a He gas, the He gas was not absorbed on the ceramics and the sealing property was evaluated precisely.

On the other hand, the sample No. 1 containing not less than 95% by weight of a glass that contains SiO$_2$, Al$_2$O$_3$, MgO, ZnO and B$_2$O$_3$ was melted. The sample No. 2 exhibited a dielectric loss in excess of 50×10$^{-4}$. The samples Nos. 14 and 15 containing smaller than 50% by weight of the glass could not be sintered at low temperatures and could not be densely formed. The sample No. 8 containing smaller than 0.1% by weight of SrSiO$_3$ failed to achieve a coefficient of thermal expansion of not smaller than 5.5 ppm/° C. In the sealing test, furthermore, the measurement was not correctly taken due to the adsorption of helium by the ceramics, and the wiring board was not determined to be reliable.

The samples Nos. 9, 10, 22 and 23 were blended with Al$_2$O$_3$ or cordierite as additives to the glass. However, crystals of cordierite and Al$_2$O$_3$ precipitated much in the sintered products, and small coefficients of thermal expansion were exhibited.

In the samples Nos. 24 to 27 using the glasses C and D without containing MgO or ZnO, the spinel type crystal phase did not precipitate, and increased dielectric losses were exhibited.

In the sample No. 28 using the glass E containing large amounts of B$_2$O$_3$ in combination with CaSiO$_3$ and Al$_2$O$_3$, the amount of the amorphous glass containing B$_2$O$_3$ was large, and no quartz precipitated. Therefore, the dielectric loss was great in a high-frequency band.

EXAMPLE 2

To the crystallized glass powders A and B used in Example 1 were mixed an SrSiO$_3$ powder, a CaZrO$_3$ powder, and an SiO$_2$ (quartz) power having average particle diameters of not larger than 1 μm to comply with the compositions shown in Tables 3 and 4.

To the mixtures were added an organic binder, a plasticizer and toluene to prepare slurries which were then molded into green sheets having a thickness of 300 μm by the doctor blade method. Five pieces of the green sheets were laminated one upon the other and were adhered at a temperature of 50° C. under a pressure of 100 kg/cm$^2$. After the binder was removed in a water vapor-containing nitrogen atmosphere at 700° C., the obtained laminated sheets were fired in dry nitrogen under the conditions shown in Tables 3 and 4 to obtain ceramics for insulating substrates.

The dielectric constants, dielectric losses and coefficients of thermal expansion of the thus obtained ceramics were calculated in the same manner as in Example 1, and their crystal phases were identified. Furthermore, the fired surfaces of the ceramics were measured for their three-point bending strengths (JIS R-1601) at room temperature. The results were as shown in Tables 3 and 4.

For some samples, an Al$_2$O$_3$ powder and a cordierite powder were used as filler components instead of SrSiO$_3$, SiO$_2$ and CaZrO$_3$, and the ceramics were prepared in the same manner and were evaluated (samples Nos. 9, 10, 25, 26). Instead of the crystallized glasses A and B, furthermore, the glasses C, D and E used in Example 1 were used to evaluate the ceramics in the same manner as described above (samples Nos. 27 to 31).

TABLE 3

| Sample No. | Glass kinds | Glass amount | Filler SiO$_2$ | Filler SrSiO$_3$ | Filler others | Firing condition temp. (°C.) | Firing condition time (hr) | Dielectric const. | Dielectric loss ×10$^{-4}$ | Coefficient of thermal expansion (ppm/°C.) | Flexural strength (MPa) | Detected crystal phase Note 1) |
|---|---|---|---|---|---|---|---|---|---|---|---|---|
| *1 | A | 97 | — | 1 | CaZrO$_3$ 2 | 850 | 1 | — | — | — | — | melted |
| *2 | A | 96 | 1 | — | CaZrO$_3$ 3 | 900 | 1 | 4.8 | 53 | 9.5 | 190 | Si > SP > Co > Z |
| 3 | A | 89 | 4.4 | 0.1 | CaZrO$_3$ 6.5 | 850 | 1 | 5.4 | 43 | 9.5 | 220 | Si > SP > SL > Z |
| 4 | A | 75 | 4.5 | 14.5 | CaZrO$_3$ 6 | 875 | 1 | 5.7 | 28 | 8.6 | 230 | Si > SP > SL > Z |
| 5 | A | 67 | 9.5 | 19 | CaZrO$_3$ 4.5 | 900 | 1 | 5.7 | 18 | 7.7 | 230 | Si > SL > SP > Z |
| 6 | A | 62 | 9.5 | 24 | CaZrO$_3$ 4.5 | 925 | 1 | 5.9 | 21 | 7.4 | 230 | SL > Si > SP > Z |
| 7 | A | 65 | — | 28.5 | CaZrO$_3$ 6.5 | 850 | 0.5 | 5.5 | 26 | 5.5 | 230 | SL > Si > SP > Z |
| *8 | A | 90 | 5.45 | 0.05 | CaZrO$_3$ 4.5 | 825 | 1 | 5.2 | 32 | 5.0 | 210 | SP > Si > Co > Z |
| *9 | A | 73 | — | — | Al$_2$O$_3$ 24 CaZrO$_3$ 3 | 975 | 1 | 5.9 | 49 | 5.2 | 220 | SP > Al > Co > Z |
| *10 | A | 71 | — | — | cordierite 24 CaZrO$_3$ 5 | 1000 | 1 | 5.5 | 105 | 4.9 | 220 | Co > SP > Z |
| 11 | A | 50 | 4.9 | 45 | CaZrO$_3$ 0.1 | 950 | 1 | 6.5 | 22 | 5.7 | 210 | SL > Si > SP > Z |
| 12 | A | 50 | — | 49.5 | CaZrO$_3$ 0.5 | 975 | 1 | 6.8 | 25 | 5.5 | 215 | SL > Si > SP > Z |
| *13 | A | 50 | 44 | 4 | CaZrO$_3$ 2 | 1000 | 2 | not dense | | — | — | |
| *14 | A | 29 | 19 | 49 | CaZrO$_3$ 3 | 1000 | 3 | not dense | | — | — | |
| *15 | A | 44 | — | 54 | CaZrO$_3$ 2 | 1000 | 1 | not dense | | — | — | |
| 16 | A | 61 | 18 | 14 | CaZrO$_3$ 7 | 850 | 1 | 5.5 | 27 | 10.0 | 240 | SP > SL, Si > Z |
| 17 | A | 70 | 22.9 | 0.1 | CaZrO$_3$ 7 | 950 | 1 | 5.3 | 21 | 11.3 | 230 | Si > SP > SL > Z |

Samples marked with * lie outside the scope of the invention.
Note 1) SP: spinel, SL: slawsonite, Co: cordierite, Si: quarts, Al: Al$_2$O$_3$, Z: ZrO$_2$

TABLE 4

| Sample No. | Glass kinds | Glass amount | Filler SiO$_2$ | Filler SrSiO$_3$ | Filler others | Firing condition temp. (°C.) | Firing condition time (hr) | Dielectric const. | Dielectric loss ×10$^{-4}$ | Coefficient of thermal expansion (ppm/°C.) | Flexural strength (MPa) | Detected crystal phase Note 1) |
|---|---|---|---|---|---|---|---|---|---|---|---|---|
| *18 | B | 50 | 0.95 | 49 | CaZrO$_3$ 0.05 | 950 | 1 | 5.4 | 23 | 5.5 | 195 | SL > Si > SP > Z |
| *19 | B | 60 | 10 | 30 | — | 950 | 1 | 5.3 | 25 | 5.6 | 190 | SL > Si > SP > Z |
| *20 | B | 60 | 3 | 20 | CaZrO$_3$ 17 | 925 | 1 | 8.0 | 70 | 5.2 | 230 | SL > Si > Z > SP |
| 21 | B | 50 | 1 | 46 | CaZrO$_3$ 3 | 950 | 1 | 6.8 | 26 | 5.5 | 220 | SL > Si > SP > Z |
| 22 | B | 59 | 9.5 | 28 | CaZrO$_3$ 3.5 | 950 | 1 | 6.0 | 25 | 5.6 | 230 | SL > Si > SP > Z |
| 23 | B | 65 | 4.5 | 24 | CaZrO$_3$ 6.5 | 925 | 1 | 5.9 | 24 | 5.9 | 240 | SL > Si > SP > Z |
| 24 | B | 76 | — | 18 | CaZrO$_3$ 6 | 875 | 1 | 6.1 | 22 | 6.7 | 250 | Si > SL > SP > Z |
| *25 | B | 83.5 | — | — | Al$_2$O$_3$ 14.5 CaZrO$_3$ 2 | 1000 | 1 | 6.0 | 60 | 5.1 | 210 | SP > Co > Al > Z |
| *26 | B | 76 | — | — | cordierite 19 CaZrO$_3$ 5 | 850 | 1 | 5.4 | 110 | 4.9 | 220 | SP > Co > Z |
| *27 | C | 71 | 9.5 | 14 | CaZrO$_3$ 5.5 | 800 | 1 | not measurable | | — | — | |
| *28 | C | 48 | 14 | 33 | CaZrO$_3$ 5 | 850 | 1 | 5.5 | 100 | 15.2 | 210 | Si > W > SS, CS > Z |
| *29 | D | 70 | 9.5 | 14 | CaZrO$_3$ 6.5 | 800 | 1 | not measurable | | — | — | |
| *30 | D | 56 | 23 | 15 | CaZrO$_3$ 6 | 850 | 1 | 6.0 | 150 | 17.1 | 200 | S, SL > Z |
| *31 | E | 50 | — | CaSiO$_3$ 28 | Al$_2$O$_3$ 18 CaZrO$_3$ 4 | 900 | 1 | 6.7 | 130 | 5.5 | 170 | An, S > Z |

Samples marked with * lie outside the scope of the invention.
Note 1) SP: spinel, SL: slawsonite, Co: cordierite, Si: quarts, Al: Al$_2$O$_3$, W: willemite, SS: SrSiO$_3$, CS: CaSiO$_3$, An: anorthite, Z: ZrO$_2$ As will be clear from the results of Tables 3 and 4, the ceramics of the present invention all exhibited coefficients of thermal expansion of not smaller than 5.5 ppm/° C., and excellent dielectric properties such as dielectric constants of not larger than 7, dielectric losses of not larger than 50×10$^{-4}$ as measured at frequencies of from 20 to 30 GHz, and flexural strengths of not smaller than 200 MPa. Furthermore, in the sealing test using the He gas, the gas was not absorbed on the ceramics and the sealing property was evaluated precisely.

On the other hand, the sample No. 1 containing not less than 95% by weight of a glass that contains SiO$_2$, Al$_2$O$_3$, MgO, ZnO and B$_2$O$_3$ was melted. The sample No. 2 exhibited a dielectric loss in excess of 50×10$^{-4}$. The samples Nos. 14 and 15 containing smaller than 50% by weight of the glass could not be sintered at low temperatures and could not be densely formed. The sample No. 8 containing smaller than 0.1% by weight of SrSiO$_3$ failed to achieve a coefficient of thermal expansion of not smaller than 5.5 ppm/° C. In the sealing test, furthermore, the measurement was not correctly taken due to the adsorption of helium by the ceramics, and the wiring board was not determined to be reliable.

The samples Nos. 9, 10, 25 and 26 were blended with $Al_2O_3$ or cordierite as additives to the glass. However, crystals of cordierite and $Al_2O_3$ precipitated much in the sintered products, and small coefficients of thermal expansion were exhibited.

In the samples Nos. 27 to 30 using the glasses C and D without containing MgO or ZnO, the spinel type crystal phase did not precipitate, and increased dielectric losses were exhibited.

In the sample No. 31 using the glass E containing large amounts of $B_2O_3$ in combination with $CaSiO_3$ and $Al_2O_3$, the amount of the amorphous glass containing $B_2O_3$ was large, and no quartz precipitated. Therefore, the dielectric loss was great in a high-frequency band.

In the samples Nos. 18 and 19 containing not larger than 0.1% by weight of $CaZrO_3$, the flexural strengths were smaller than 200 MPa. In the sample No. 20 containing not smaller than 15% by weight of $CaZrO_3$, the dielectric constant exceeded 7.

What is claimed is:

1. Ceramics for wiring boards having an $SiO_2$ crystal phase, a spinel type oxide crystal phase containing Mg or Zn and Al and a composite oxide type crystal phase containing at least Sr, Al and Si, and having a coefficient of thermal expansion of not smaller than 5.5 ppm/° C. at 25° C. through up to 400° C., a dielectric constant of not larger than 7, and a dielectric loss of not larger than $50 \times 10^{-4}$ at 20 to 30 GHz.

2. Ceramics according to claim 1, wherein Si is contained in an amount of from 30 to 60% by weight in terms of $SiO_2$, Al is contained in an amount of from 19 to 28% by weight in terms of $Al_2O_3$, Mg is contained in an amount of from 5 to 13% by weight in terms of Mgo, Zn is contained in an amount of from 5 to 35% by weight in terms of ZnO, B is contained in an amount of from 5 to 12% by weight in terms of $B_2O_3$, and Sr is contained in an amount of from 1 to 3% by weight in terms of SrO.

3. Ceramics according to claim 1, wherein said $SiO_2$ crystal phase is quartz.

4. Ceramics according to claim 1, wherein said spinel type oxide crystal phase exists as a spinel crystal phase represented by $MgAl_2O_4$, a gahnite crystal phase represented by $ZnAl_2O_4$ or a mixed phase thereof.

5. Ceramics according to claim 1, wherein said composite oxide type crystal phase is a slawsonite crystal phase represented by $SrAl_2Si_2O_8$.

6. Ceramics according to claim 1, wherein said composite oxide type crystal phase further contains Ca.

7. Ceramics according to claim 6, wherein said composite oxide type crystal phase is a slawsonite crystal phase represented by $Sr_{1-x}Ca_xAl_2Si_2O_8$ (wherein x is a number 0<x<1).

8. Ceramics according to claim 6, wherein a $ZrO_2$ crystal phase is further contained.

* * * * *